United States Patent [19]

Haun et al.

[11] Patent Number: 4,613,784
[45] Date of Patent: Sep. 23, 1986

[54] TRANSVERSELY REINFORCED PIEZOELECTRIC COMPOSITES

[75] Inventors: Michael J. Haun; Robert E. Newnham, both of State College, Pa.; Walter A. Schulze, Alfred Station, N.Y.

[73] Assignee: The United States of America as represented by the Secretary of the Navy, Washington, D.C.

[21] Appl. No.: 684,529

[22] Filed: Dec. 21, 1984

[51] Int. Cl.$^4$ ............................................. H01L 41/08
[52] U.S. Cl. ................................. 310/358; 252/62.9; 428/113; 428/221; 428/413; 428/417; 428/423.1
[58] Field of Search ............... 428/221, 113, 413, 417, 428/423.1; 310/358, 357, 359

[56] References Cited

U.S. PATENT DOCUMENTS

| | | | |
|---|---|---|---|
| 4,252,588 | 2/1981 | Kratsch et al. | 428/113 |
| 4,268,560 | 5/1981 | Maistre | 428/113 |
| 4,390,583 | 6/1983 | Brazel | 428/113 |
| 4,412,148 | 10/1983 | Klicker et al. | 310/358 |
| 4,422,003 | 12/1983 | Safari et al. | 310/358 |
| 4,448,832 | 5/1984 | Kidwell | 428/113 |
| 4,513,043 | 4/1985 | Smades | 428/113 |

Primary Examiner—James J. Bell
Attorney, Agent, or Firm—Robert F. Beers; Arthur A. McGill; Prithvi C. Lall

[57] ABSTRACT

Piezoelectric PZT-polymer composites of 1-3 and 1-3-0 connectivity are transversely reinforced with glass fibers to increase the hydrostatic piezoelectric charge and voltage coefficients ($\bar{d}_h$ and $\bar{g}_h$) for possible use in hydrophone applications. These composites consisted of a foamed (with porosity) or non-foamed (no porosity) polymer matrix with PZT rods aligned parallel to the poling direction and glass fibers in the remaining two transverse directions. Because of the small percentage of PZT required, these composites have densities near that of water, and much lower dielectric constants than solid PZT, resulting in large increases in the hydrostatic piezoelectric voltage coefficient $\bar{g}_h$. By increasing the $\bar{d}_h$ and $\bar{g}_h$ coefficients, the $\bar{d}_h\bar{g}_h$ product, used as the figure of merit, is greatly enhanced.

10 Claims, 5 Drawing Figures

TRANSVERSELY REINFORCED PIEZOELECTRIC COMPOSITES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

Subject invention is related to piezoelectric materials and, more particularly, to 1-2-3 and 1-2-3-0 phase connected PZT-glass-polymer composites for transducer applications and the like.

(2) Description of the Prior Art

Hydrophone devices use piezoelectric materials to act as passive listening devices for low frequency acoustic waves. Since the wave lengths of the acoustic signals are much greater than the dimensions of these devices, the stress resulting from the acoustic signals is effectively hydrostatic. The sensitivity of a hydrophone is determined by the voltage that is produced from this hydrostatic pressure. The hydrostatic piezoelectric voltage coefficient ($g_h$) relates the electric field (=voltage/thickness) of a piezoelectric material to the applied hydrostatic stress, and is a useful parameter for evaluating a material for use in a hydrophone.

The $g_h$ (hydrostatic voltage coefficient) is usually given by:

$$g_h = d_h / K_{33}\epsilon_0$$

where $d_h$ is the hydrostatic piezoelectric charge coefficient, $K_{33}$ is the dielectric constant in the $x_3$-direction (the poling direction), and $\epsilon_0$ is the permittivity of free space. The $d_h$ coefficient relates the polarization (=charge/area) produced from an applied hydrostatic stress. A large value of $d_h$ and low value of dielectric constant ($K_{33}$) are desired for hydrophone material to have a large value of $g_h$ (piezoelectric hydrostatic voltage coefficient) and thus high sensitivity. The product of the $d_h$ and $g_h$ is often used as the figure of merit of a material for use in hydrohone applications.

In addition to large $d_h$ and $g_h$ coefficients, hydrophones also have other requirements. The piezoelectric element within the device should be acoustically impedance-matched to water. The hydrophone should also be rugged enough to withstand mechanical shock from pressure fluctuations. Finally, if the device is to be mounted on the hull of a ship, at least limited flexibility is also essential.

Lead zirconate titanate (PZT) has traditionally been used for hydrophone devices, but it has several disadvantages. Even though the magnitude of the piezoelectric charge coefficients $d_{33}$ and $d_{31}$ are large, the hydrostatic piezoelectric charge coefficient $d_h$ (=$d_{33}+2d_{31}$) is low, because the $d_{33}$ an $d_{31}$ coefficients are opposite in sign. The hydrostatic piezoelectric voltage coefficient ($g_h$) is also low, due to the high dielectric constant ($K_{33}$) of PZT. Consequently, low values of the $g_h$ and $d_h$ result in a low figure of merit for the PZT materials. To increase the hydrostatic sensitivity, thin-walled cylinders and spheres of PZT have been used to convert the hydrostatic stress into an axial stress. However, physical stability of these devices is a problem because the cylinders and spheres are easily broken by mechanical shock or by failure of the seals under pressure. The stiff dense PZT also has the disadvantage of not acoustically matching well to water. Matching layers are presently used to improve the acoustical coupling between PZT and water. Due to the stiffness of PZT, these devices do not conform easily to the hull of a ship. These disadvantages of PZT show that a definite need exists for the development of improved materials for hydrophone devices.

The properties of single-phase materials such as PZT conflict with the desired properties for hydrophone applications. To obtain a high value of $g_h$, $d_h$ coefficient must be large accompanied by a low dielectric constant $K_{33}$. The problem with single-phase materials, such as PZT, is that by increasing $d_{ij}$ coefficients, normally the dielectric constant also increases. The materials with the highest $d_{ij}$ coefficients are piezoelectric ceramics that are brittle, dense and stiff. Thus, all the desired properties of a hydrophone device cannot be accomplished by using single-phase ceramic materials.

To solve the conflicting requirements of hydrophone devices, piezoelectric composites of PZT and polymer have been fabricated with the desirable properties of each phase. The PZT supplies the piezoelectric activity of the composite, while the polymer lowers the dielectric constant ($K_{33}$) and density, and adds flexibility. Through the proper selection of the connectivity and properties of the phases, the $d_{33}$ and $d_{31}$ coefficients can be decoupled, resulting in the enhancement of the $d_h$ (hydrostatic piezoelectric coeffcient) compared to single-phase PZT. By replacing most of the PZT (high $K_{33}$) with polymer low ($K_{33}$), the dielectric constant can be significantly reduced, resulting in enhanced $g_h$ coefficient.

One type of connectivity pattern that has been particularly successful is the 1-3 composite with PZT rods aligned in the poling direction ($X_3$-direction) held together by a polymer matrix. In the notation 1-3, one (1) refers to the one-dimensionally connected PZT phase and the three (3) refers to the three-dimensionally connected polymer phase. The stiffer PZT rods support most of an applied stress in the $x_3$-direction, because of the parallel connection with the more compliant polymer phase. In the $x_1$- and $x_2$-directions of the composite (using an orthogonal axes system), the PZT rods are connected in series with the more compliant polymer matrix, causing the stress to be shared more evenly between the two phases. With the proper selection of the elastic properties of the polymer phase, the $\bar{d}_{31}$ coefficient can be reduced to a greater extent than the reduction of the $\bar{d}_{33}$ coefficient. Hence, the $d_h$ coefficient for a 1-3 composite can be increased compared to its low value for single-phase PZT.

The $\bar{d}_{33}$ coefficient of a 1-3 composite can be improved by increasing the longitudinal compliance of the polymer. The most compliant polymers usually have high Poisson's ratio. A large longitudinal compliance coefficient ($s_{11}$) and a high Poisson's ratio ($\nu_{13}$), result in a large $s_{13}$ (=$-\nu_{13}s_{11}$) transverse compliance coefficient. Polymers generally have much greater $s_{13}$ coefficients than those for ceramics, such as PZT. In a 1-3 composite adverse internal stresses develop at the PZT-polymer interface due to the difference in the $s_{13}$ compliance coefficients of the phases, resulting in a contribution to the $\bar{d}_{31}$ coefficient. 1-3 composites fabricated with an epoxy (relatively low $s_{11}$ and $\nu_{13}$) matrix have larger $\bar{d}_h$ than when a polyurethane (relatively high $s_{11}$ and $\nu_{13}$) matrix is used. The composites with a polyurethane matrix have larger $\bar{d}_{33}$, but also have larger $\bar{d}_{31}$ coefficients compared to the epoxy matrix composites. The high Poisson's ratio of polyurethane (0.5) causes the material to be hydrostatically incompressible, resulting in a low $\bar{d}_h$ coefficient.

Porosity has been added to polyurethane to allow the matrix to be compressible. 1-3-0 connectivity notation is used to describe a 1-3 composite with a porous polymer matrix (i.e., polymer in the form of a foam). The 0 refers to the polymer porosity, which is not connected in any orthogonal direction through the composite. With the addition of porosity, the Poisson's ratio decreases more than the increase of the $s_{ll}$ coefficient, resulting in a lower $s_{13}$. Thus the internal stresses are decreased, reducing the $\bar{d}_{31}$ coefficient. This enhances the $\bar{d}_h$ coefficient, but only at low hydrostatic pressures. But as the pressure is increased, the pores collapse, and the $\bar{d}_h$ coefficient is reduced.

The addition of hollow glass spheres to the polymer matrix has also been used to reduce the $s_{13}$ compliance coefficient of the polymer, without the severe pressure dependence found with the addition of porosity. However, due to the stiffness of the glass spheres, only a small enhancement in the $\bar{d}_h$ coefficient was obtained.

In view of the foregoing remarks, it is desirable to have composite materials which have high values of $g_h$ and $d_h$ resulting in a high figure of merit ($d_h g_h$) for such materials for fabricating hydrophones despite their conflicting requirements.

SUMMARY OF THE INVENTION

A PZT-glass-polymer composite according to the teachings of subject invention is fabricated with the desirable properties for each phase. The composite is obtained by the addition of glass fibers aligned in the $x_1$- and $x_2$-direction in a composite material of 1-3 connectivity, i.e., a composite material wherein PZT rods are aligned in the $x_3$-direction, $x_1$-, $x_2$- and $x_3$-directions forming an orthogonal system and $x_3$-direction being the direction of the applied electric field. If numeral 2 is used to represent the glass fibers connected through the composite in two perpendicular directions, i.e., $x_1$- and $x_2$-directions, 1-2-3 connectivity pattern represents transversely reinforced 1-3 composite material which includes a polymer with PZT-rods aligned in the $x_3$-direction. If the composite material is in the form of a foam, i.e., having porosity, it is designated as having 1-2-3-0 connectivity pattern. By using the teachings of subject invention, alignment racks are made from a pair of brass discs with a square array of holes drilled in each. The discs are bolted together so as to pass PZT rods or glass fibers through corresponding holes aligning the PZT rods and glass fibers in place. The alignment racks are suspended over molds with an epoxy such as the well known Spurrs epoxy or the like and cured. The epoxy serves as a base to hold the PZT rods or glass fibers in place and the brass rack is removed. Thus, two glass fiber arrays are interposed in the $x_1$- and $x_2$-directions through a PZT array. This arrangement provides the basic structure of a composite of 1-2-3 connectivity. In a similar manner a composite with 1-2-3-0 connectivity is fabricated where 0 designates the polymer porosity which means that the polymer is in the form of a foam.

An object of subject invention is to fabricate a PZT-glass-polymer composite of 1-2-3 connectivity.

Another object of subject invention is to fabricate a PZT-glass-polymer composite in the form of a foam with 1-2-3-0 connectivity.

Still another object of subject invention is to fabricate PZT-glass-polymer composite which has high values of $g_h$ and $d_h$.

Still another object of subject invention is to fabricate a PZT-glass-polymer composite which has a high figure of merit for transducer applications.

Other objects, advantages and novel features of the invention will become apparent from the following detailed description thereof wherein considered in conjunction with the accompanying drawings wherein:

DESCRIPTION OF A PREFERRED EMBODIMENT

Figure 1:
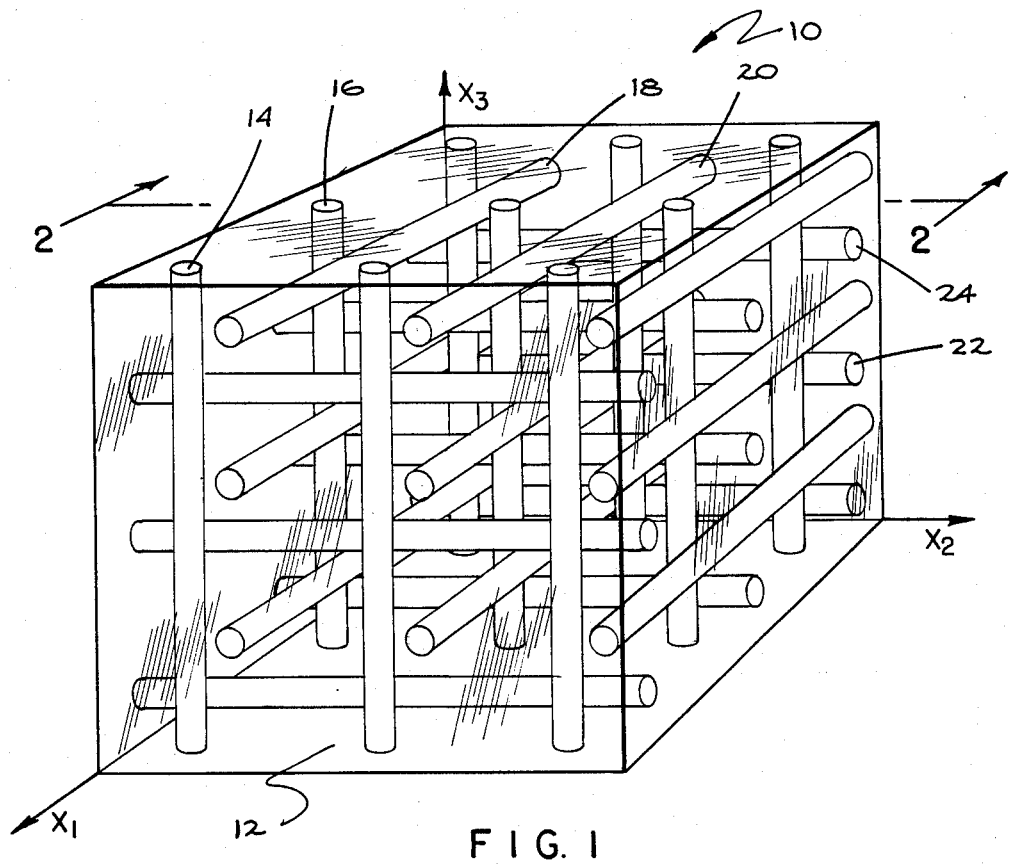
FIG. 1 is a perspective view of a piece of PZT-glass-polymer composite having a connectivity pattern of 1-2-3.
Figure 2:
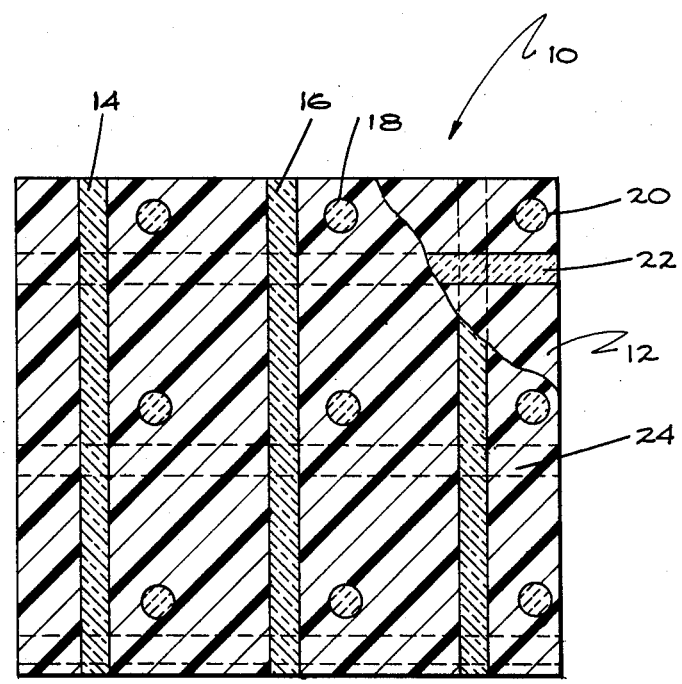
FIG. 2 is a cross-section of the material of FIG. 1 taken along line 2—2 thereof.

Referring to the drawings wherein like numbers represent like parts throughout, FIG. 1 shows schematically a piece 10 of PZT-glass-polymer composite built according to the teachings of subject invention. Piece 10 includes a polymer 12 and a plurality of PZT rods such as 14 and 16 embedded therein in the $x_3$-direction which is the direction of the electric field, and a first plurality of glass rods or fibers such as 18 and 20 parallel to the $x_1$ direction and a second plurality of glass rods or fibers such as 22 and 24 parallel to the $x_2$-direction. A cross-sectional view of piece 10 is shown in FIG. 2.

A fabrication procedure for PZT-polymer composites with connectivities of 1-3 and 3-2 has been described in U.S. Pat. No. 4,422,003 to Safari et al which is incorporated herein by reference. The procedure outlined in the above-identified reference was modified with additional steps used to align glass (such as well known E-glass) fibers in the transverse directions to the PZT rods. Alignment racks were made from two 1.8 centimeter diameter brass discs with a square array of holes drilled in each. The two discs were bolted together so that PZT rods or glass fibers could be passed through corresponding holes aligning the rods or fibers in place. The alignment racks were suspended over molds, which were filled with an epoxy, preferably Spurrs epoxy, and cured. It should be pointed out that any other polymer material besides Spurrs epoxy can also be used without deviating from the teachings of subject invention. The epoxy served as a base to hold the PZT rods or glass fibers in place so that the brass racks could be removed. Two glass fiber arrays were interposed in the $x_1$- and $x_2$-direction through a PZT array. This arrangement provided the basic structure of a PZT-glass-polymer composite of 1-2-3 connectivity. The PZT-glass-fiber structures were placed in a mold and vacuum impregnated in either Spurrs epoxy, encapsulated polyurethane or 10-volume percent-foamed polyurethane. After curing the polymer, samples were cut to a thickness of 4.5 millimeters along the $x_3$-direction. A diamond saw was used to cut the stiff epoxy matrix composite, but could not be used for the compliant polyurethane matrix composites. Instead an electric belt sander was used which may have caused some PZT rods to fracture. To prevent the penetration of oil, the foamed polyurethane composites were encapsulated in Spurrs epoxy. This encapsulation also provided additional tranverse reinforcements to the composite. Air-dry silver was used to electrode the epoxy and polyurethane matrix composites and silver epoxy was used for the foamed polyurethane matrix composite. For comparison, 1-3 composite samples without transverse reinforcements were also fabricated. The samples were poled in a 70° C. oil bath with a field of 22 KV/C applied for five minutes. After aging for at least twenty-four hours, the dielectric and piezoelectric properties were measured. The capacitance and dissipation factors were measured using a standard Hewlett-Packard 427A multi-frequency LCR meter at 1 KHz under atmospheric pressure and also under hydrostatic pressure for use in $\bar{d}_h$ and $\bar{g}_h$ calculations at higher pressures. The $\bar{d}_{33}$ coefficient was measured dynamically using a Berlincourt piezo $\bar{d}_{33}$-meter, with the electromagnetic driver operating at a frequency of 100 Hz. Two standard techniques were used to determine the hydrostatic piezoelectric coefficients: a static Ramp method and a dynamic A.C. method which are quite well known in the prior art. These methods are fully discussed in K. A. Klicer's Ph.D. thesis submitted at The Pennsylvania State University in 1980 and S. Y. Lynn's M.S. thesis submitted at The Pennsylvania State University in 1982, respectively, and are herein incorporated by reference. The static Ramp method was used to measure all the samples fabricated in the study and the A.C. method was used to measure samples for camparison.

Figure 3:
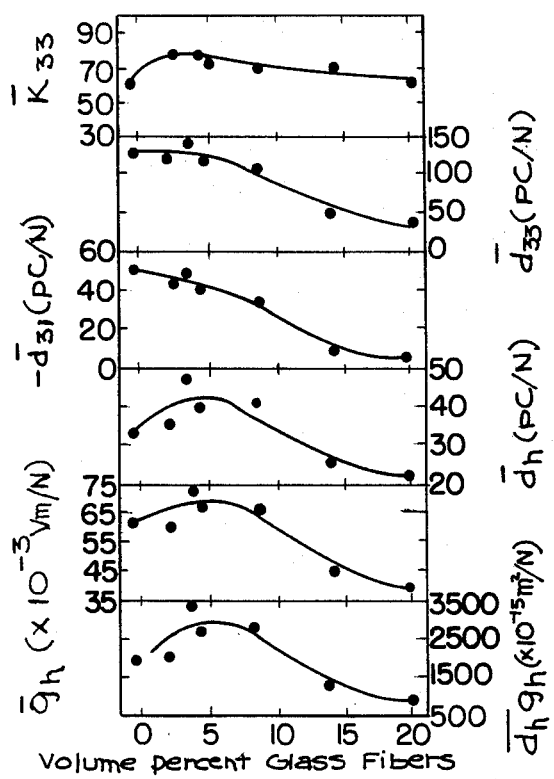
FIG. 3 is a graphical representation of the dielectric and piezoelectric properties plotted versus the volume percentage of glass fibers for epoxy matrix composites with five volume percent PZT.

Composite samples with 1-3, 1-3-0, 1-2-3 and 1-2-3-0 connectivity were fabricated and tested according to the above-described experimental procedure. The dielectric and piezoelectric properties obtained are plotted as a function of the volume of percentage of glass fibers in FIGS. 3, 4 and 5 for epoxy, polyurethane and encapsulated ten-percent-foamed polyurethane matrix composites, respectively. As can be seen from FIS. 3-5 the dielectric constant increased slightly with the addition of glass fibers for the epoxy matrix composites with five percent PZT. During the curing of the polymer, thermal expansion differences create compressive stresses that may effectively clamp the PZT rods and thus reduce the dielectric constant. If the glass fibers support some of this compressive stress, then the dielectric constant would increase due to less clamping.

The $\bar{d}_{33}$ coefficient of the epoxy matrix composites decreased as the percentage of glass fibers was increased because the glass supported part of the stress in the $x_3$- direction, decreasing the stress on the PZT. The magnitude of the $\bar{d}_{31}$ *l coefficient, calculated from the measured* $\bar{d}_{33}$ and $\bar{d}_h$ coefficients, also decreased with the addition of glass fibers. The glass fibers decreased both the shear stresses at the interface (due to the mismatch in s13 compliance coefficients) and the longitudinal stresses on the PZT in the $x_1$- and $x_2$- directions, and thus reduce the magnitude of the $\bar{d}_{31}$ coefficient. The hydrostatic coefficients $\bar{d}_h$ and $\bar{g}_h$ and the $\bar{d}_h\bar{g}_h$, figure of merit initially increased with the addition of glass fibers, but then decreased when the composite was significanty stiffened in the $x_3$- direction causing a large reduction in the $\bar{d}_{33}$ coefficient.

Figure 4:
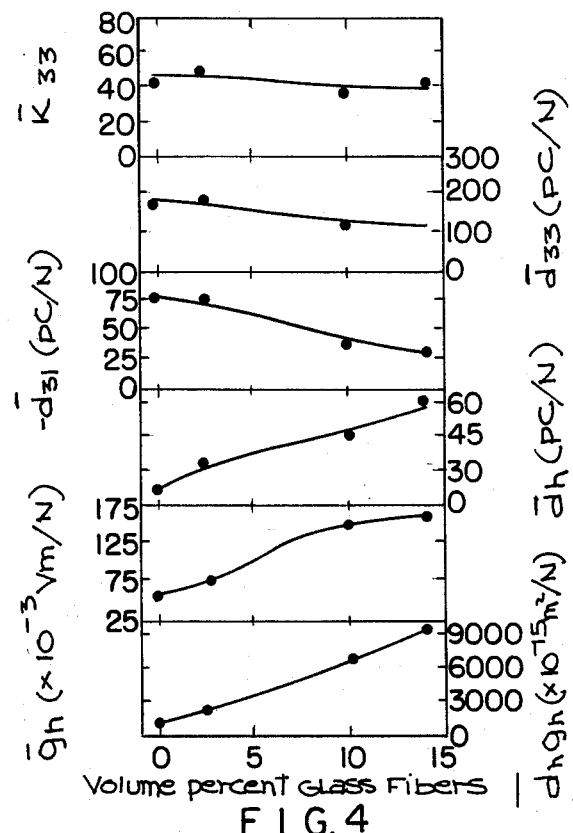
FIG. 4 is a graphical representation of the dielectric and piezoelectric properties plotted versus the volume percentage of glass fibers for polyurethane matrix composites with five volume percent PZT.

FIG. 4 shows the properties of polyurethane matrix composites with five percent PZT. The dielectric constant of these composites did not significantly change with the addition of glass fibers, but the magnitudes were lower than that of the epoxy matrix composites, which had the same volume fraction of PZT. The high compliance of polyurethane may have allowed some PZT rods to be broken during the fabrication of these composites, thus giving lower dielectric constants. Without transverse reinforcement the $\bar{d}_h$ coefficient was lower for the polyurethane matrix composites than that for the epoxy matrix composites, even though the compliance of polyurethane is more than an order of magnitude greater than the epoxy compliance which is due to the incmpressible nature of polyurethane (high Poisson's ratio). With the addition of glass fibers the $\bar{d}_{33}$ coefficient remained large due to the high compliance of the polyurethane, but the magnitude of the $\bar{d}_{31}$ coefficient was slightly reduced resulting in an enchanced $\bar{d}_h$ coefficient. The $\bar{g}_h$ was also increased with the addition of glass fibers and the $\bar{d}_h\bar{g}_h$ figure of merit was increased by almost an order of magnitude with the addition of 14 percent glass fibers.

Figure 5:
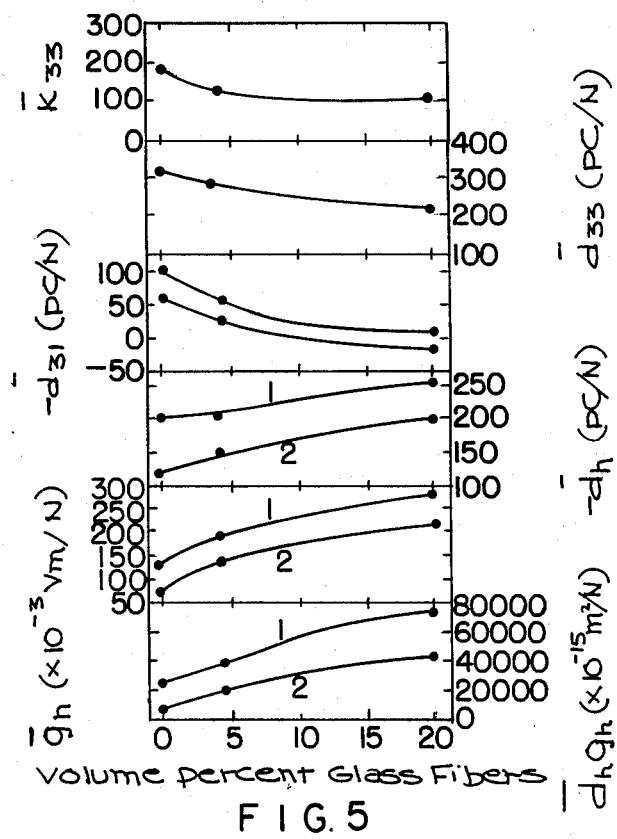
FIG. 5 is a graphical representation of the dielectric and piezoelectric properties plotted versus the volume percentage of glass fibers for encapsulated ten-percent foamed polyurethane matrix composite with thirteen volume percent PZT.

FIG. 5 shows the properties of encapsulated foamed polyurethane matrix composites with 13 volume percent PZT rods. The dielectric constant decreased with the addition of glass fibers, possibly due to an additional breakage of PZT rods during fabrication. The breakage would also contribute to the decrease of the $\bar{d}_{33}$ coefficient. The hydrostatic piezoelectric coefficients were determined using both the Ramp and A.C. techniques. Even though the $\bar{d}_{33}$ coefficient decreased with the addition of glass fibers, the $\bar{d}_h$ coefficient increased, due to the large reduction in in the magnitude of the $\bar{d}_{31}$ coefficient. Thus the $\bar{g}_h$ coefficient and $\bar{d}_h\bar{g}_h$ figure of merit was significantly enhanced in the addition of glass fibers.

The $\bar{d}_h$ coefficient determined from the standard Ramp method gave higher results than from the conventional A.C. method, due to the viscoelasticity of the polyurethane. Using the Ramp method, the full viscoelastic deformation did not have time to occur, due to the fast increase in pressure. A static pressure was applied using the A.C. method allowing the polymer to deform completely, and thus a lower $\bar{d}_h$ coefficient resulted. The difference in $\bar{d}_h$ coefficients using the two techniques was shown to be much less for epoxy matrix composites, because epoxy is less viscoelastic than polyurethane.

The $\bar{d}_{31}$ coefficient determined from the standard Ramp method becomes positive with the addition of twenty percent glass fibers. Theoretically, a positive $\bar{d}_{31}$ coefficient should not be possible in a 1-3 type composite when the matrix is more compliant than the one-dimensionally connected phase. Thus the $\bar{d}_h$ coefficients determined from the Ramp method are probably higher than the true values. However, using the A.C. method more realistic values were obtained.

Table 1 shows a comparison of the densities, and dielectric and piezoelectric properties of single-phase PZT and a 1-2-3-0 composite (i.e., with 1-2-3 connectivity and porosity). The density of the composite is much closer to the density of seawater, resulting in a better acoustical match with water than that of PZT. In the composite most of the PZT has been replaced with polymer. Thus the dielectric constant was reduced by more than an order of magnitude. The PZT rods in the composite support most of the stress in the $x_3$-direction, while the glass fibers support most of the stress in the $x_1$- and $x_2$-directions and also decrease the adverse internal stresses. This results in a reduction of the $\bar{d}_{31}$ coefficient by a factor of forty, but the $\bar{d}_{33}$ coefficient by only a factor of two. Hence, the $\bar{d}_h$ coefficient was increased by almost a factor of five. The increase of $\bar{d}_h$ coefficient and decrease of the dielectric constant, caused the $\bar{g}_h$ coefficient to increase by nearly two orders of magnitude, and the $\bar{d}_h\bar{g}_h$ figure of merit to increase by more than a factor of 400.

TABLE 1

|  | SINGLE-PHASE PZT | 1-2-3-0 COMPOSITE |
|---|---|---|
| Density (g/cc) | 7.90 | 1.25 |
| Dielectric constant $\bar{K}_{33}$ | 1760 | 104 |
| Piezoelectric coefficient $\bar{d}_{33}$ (pC/N) | 450 | 213 |
| Piezoelectric coefficient $\bar{d}_{31}$ (pC/N) | −204 | −5 |
| Piezoelectric coefficient $\bar{d}_h$ (pC/N) | 42 | 203 |
| Piezoelectric coefficient $\bar{g}_h$ ($\times 10^{-3}$) Vm/N | 2.7 | 220 |
| Figure of merit $\bar{d}_h\bar{g}_h$ ($\times 10^{-15}$ m²/N) | 110 | 44,700 |

Thus transverse reinforcement of 1-3 and 1-3-0 piezoelectric composites with glass fibers shows significant improvement in the hydrostatic piezoelectric coefficients and figure of merit. The effectiveness of the glass fibers depends on the volume fractions of PZT rods, glass fibers, and polymer porosity, and on the Poisson's ratio and compliance of the polymer. Due to the stiffness of the eoxy matrix composites only a slight increase in the $\bar{d}_h\bar{g}_h$ figure of merit is obtained with the addition of glass fibers. However, the $\bar{d}_h\bar{g}_h$ figure of merit is significantly enhanced with the addition of glass fibers to the polyurethane and encapsulated foamed polyurethane matrix composites. Consequently, 1-2-3 and 1-2-3-0 connectivity piezoelectric composites are promising candidates for use in hydrophone applications.

Many modifications and variations of the present invention are possible in the light of the above teachings. As an example, various inactive polymers other than Spurrs epoxy but having similar properties can be used as the base material to align the PZT rods and glass fibers therein. The number of PZT rods and glass fibers used can also be varied without deviating from the teachings of subject invention. It is, therefore, to be understood that within the scope of the appended claims, the invention may be practiced as specifically described.

What is claimed is:

1. A PZT-glass-polymer composite material of 1-2-3 connectivity which comprises:
   a matrix of a polymer;
   a plurality of generally parallel PZT-rods aligned in the direction of a poling electric field secured in said matrix of the polymer;
   means for electrically poling said plurality of PZT-rods in said matrix of the polymer;
   a first plurality of glass-fibers aligned in a direction perpendicular to said plurality of PZT-rods; and
   a second plurality of glass-fibers aligned in a direction perpendicular both to the direction of said plurality of PZT-rods and to the direction of said first plurality of glass fibers.

2. The PZT-glass-polymer composite material of claim 1 wherein said composite material is in the form of a foam and has a connectivity pattern of 1-2-3-0.

3. The PZT-glass-polymer composite material of claim 1 wherein said plurality of PZT-rods are dispersed in said polymer.

4. The PZT-glass-polymer composite material of claim 3 wherein said first plurality of glass-fibers are dispersed in said polymer.

5. The PZT-glass-polymer composite material of claim 4 wherein said second plurality of glass fibers are dispersed in said polymer.

6. The PZT-glass-polymer composite material of claim 1 wherein said polymer is an epoxy.

7. The PZT-glass-polymer composite material of claim 1 wherein said polymer is a polyurethane.

8. The PZT-glass-polymer composite material of claim 1 wherein said first plurality of glass fibers and second plurality of glass fibers are made of E-glass.

9. The PZT-glass-polymer composite material wherein said plurality of PZT-rods are of variable diameter for obtaining desired characteristics of said composite material.

10. The PZT-glass-polymer composite material wherein said first plurality of glass-fibers and said second plurality of glass fibers are of variable diameter for obtaining desired characteristics of said composite material.

* * * * *